United States Patent [19]
Lee et al.

[11] Patent Number: 5,773,343
[45] Date of Patent: Jun. 30, 1998

[54] SEMICONDUCTOR DEVICE HAVING A RECESSED CHANNEL STRUCTURE AND METHOD FOR FABRICATING THE SAME

[75] Inventors: Sung Chul Lee; Min Gyu Lim, both of Chungcheongbuk-do, Rep. of Korea

[73] Assignee: LG Semicon Co., Ltd., Chungcheongbuk-do, Rep. of Korea

[21] Appl. No.: 512,644

[22] Filed: Aug. 8, 1995

[30] Foreign Application Priority Data

May 12, 1995 [KR] Rep. of Korea .................. 11775/1995

[51] Int. Cl.⁶ .............................................. H01L 21/8247
[52] U.S. Cl. ........................................... 438/259; 438/589
[58] Field of Search ................................ 437/43, 44, 67, 437/203, 915; 438/257, 259, 270, 589, 594

[56] References Cited

U.S. PATENT DOCUMENTS

| | | | |
|---|---|---|---|
| 5,045,490 | 9/1991 | Esquivel et al. | 437/43 |
| 5,071,782 | 12/1991 | Mori | 437/203 |
| 5,429,970 | 7/1995 | Hong | 437/43 |
| 5,583,066 | 12/1996 | Jung | 437/43 |

OTHER PUBLICATIONS

"Reliability Performance of ETOX Based Flash Memories" 1988—pp. 158–166 (Apr. 1988).

*Primary Examiner*—Chandra Chaudhari

[57] ABSTRACT

A semiconductor device having a recessed channel structure which has a semiconductor region positioned at a level above a channel region, including a first conduction type substrate having a channel region therein, a second conduction type semiconductor region formed on the substrate excluding the channel region, a first insulation film formed on the semiconductor region, a second insulation film formed on a surface between the channel region and the semiconductor region, a first gate formed on a gate insulation film on the channel region, and a dielectric film formed between the first gate and the first insulation film. Also, a method for fabricating a semiconductor device having a recessed structure, including the steps of: forming a second conduction type polysilicon film on a first conduction type substrate; forming a first insulation film on the polysilicon film; forming a semiconductor layer by etching the first insulation film and the underlying polysilicon film; forming a second insulation film on an exposed surface of the substrate between the semiconductor layer and at sides of the semiconductor layer and the first insulation film; forming a first gate on the second insulation film; forming a dielectric film on a surface between the first gate and the second insulation film; and forming a second gate on the dielectric film.

18 Claims, 10 Drawing Sheets

F I G. 7A
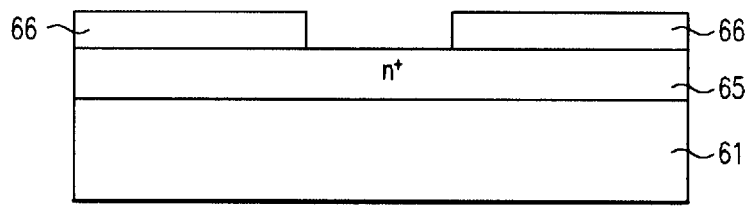
F I G. 7B
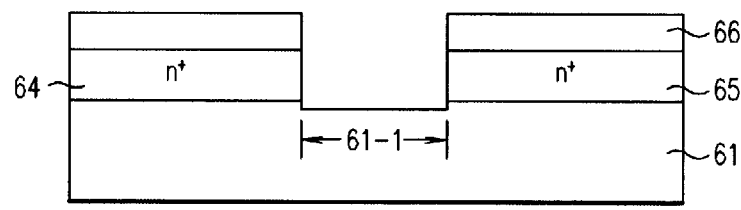
F I G. 7C
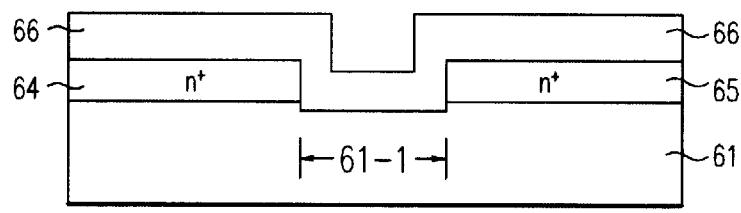
F I G. 7D
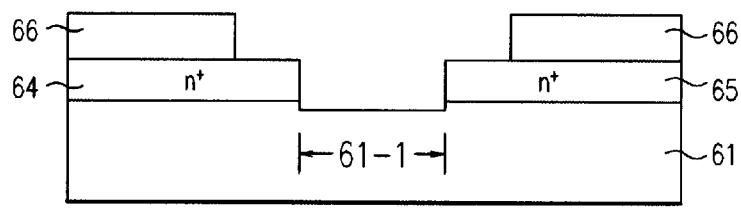

SEMICONDUCTOR DEVICE HAVING A RECESSED CHANNEL STRUCTURE AND METHOD FOR FABRICATING THE SAME

BACKGROUND OF THE INVENTION

This invention relates to a non-volatile memory device, more particularly to a flash EEPROM (Flash Electrically Erasable and Programmable Read Only Memory) cell having a recessed channel structure favorable for large scale integration.

The ETOXT™, devised by Intel, is a typical flash memory device at present. The ETOXT™ flash memory device senses information stored in a memory cell using variations of a threshold voltage of a general MOS transistor according to an amount of charge accumulated in a floating gate added to the MOS transistor.

FIG. 1 shows a section of a conventional flash EEPROM cell.

Referring to FIG. 1, the conventional flash EEPROM cell includes two gates, a floating gate and a control gate, formed on a semiconductor substrate 11.

That is, the conventional flash EEPROM cell includes a floating gate 13 formed on the semiconductor substrate with a gate insulation film 12 inbetween, and a control gate 15 formed on the floating gate 13 with an interlayer insulation film 14 of a dielectric film inbetween.

And, the conventional flash EEPROM cell also includes a drain region 17 formed of a high density impurity region in a part of the semiconductor substrate on one side of a channel region and a source region formed in a part of the semiconductor substrate on the other side of the channel region made up by a high density impurity region 16 and a low density impurity region 18 surrounding the high density impurity region.

An erasing and programming (writing) operation of the conventional flash EEPROM cell having the foregoing construction will be explained hereinafter.

First, at programming, the high density impurity region 16 is grounded and the control gate 15 and the drain region 17 are applied with a high voltage, respectively. Channel hot electrons, injected into the floating gate 13 by the high voltage applied to the control gate 15, are. Accumulated in the floating gate 13. Thus, information can be written in the memory cell.

On the other hand, at erasing, the control gate 15 is grounded, and the high density impurity region 16 is applied with a high voltage. Electrons accumulated in the floating gate 13 are then transferred to the high density impurity region 16 causing the information stored in the memory cell to be erased.

In a conventional flash memory cell (which uses the hot electron effect for programming and the Fowler-Nordheim tunneling effect for erasing), in order to erase the stored information a certain amount of overlap between the high density impurity region 16 and the floating gate 13 (i.e., region "A" in FIG. 1) is required. At forming the source/drain regions, impurities, laterally diffused into the channel region as much as "C" in FIG. 1, enter into the drain region 16. Accordingly, although a length of the cell channel region of the conventional flash EEPROM cell is "D" in FIG. 1, due to the above reasons, an available length of the cell channel region is shortened into "B". The above-described shortening of the channel length restricts large scale integration of these flash memory cells.

SUMMARY OF THE INVENTION

The object of this invention is to provide a flash EEPROM cell and a method for fabricating the same which can maintain a fixed length of channel by forming the channel in a recess.

Another object of the invention is to provide a flash EEPROM cell and a method for fabricating the same which can improve the degree of large scale integration by avoiding the above-described shortening of the channel.

Another object of the invention is to provide a flash EEPROM cell and a method for fabricating the same which can control the erasing time period.

These and other objects and features of the invention can be achieved by providing a semiconductor device having a recessed structure including a substrate having a channel region therein, a source and drain formed on the substrate excluding the channel region at a level above the channel region, an insulation film formed on the surface of the channel region and a side of said source and drain, a first gate formed on said insulation film at the channel region, a dielectric film formed on the first gate, and a second gate formed on the dielectric film.

BRIEF DESCRIPTION OF THE DRAWINGS

FIGS. 7A to 7G show steps of a first method for fabricating a flash memory cell having the recessed channel structure of FIG. 6.

DETAILED DESCRIPTION OF THE INVENTION

Embodiments of this invention will be explained in detail hereinafter, referring to the attached drawings.

Figure 1:
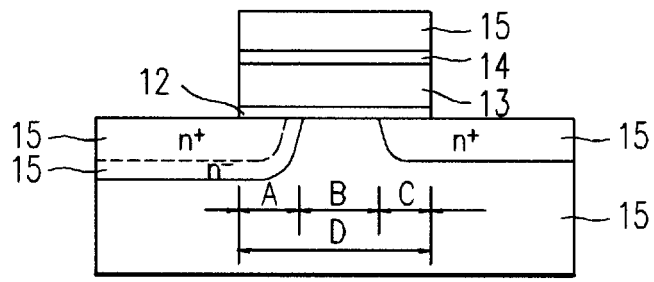
FIG. 1 shows a section of a conventional flash memory cell.
Figure 2:
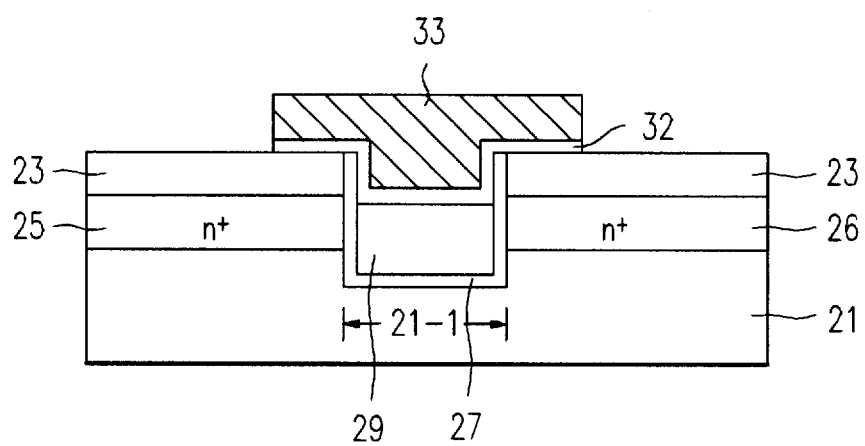
FIG. 2 shows a section of a flash memory cell having a recessed channel structure in accordance with a first embodiment of this invention.

FIG. 2 shows a section of a flash memory cell having a recessed channel structure in accordance with a first embodiment of this invention.

The flash EEPROM cell in accordance with the first embodiment of this invention includes a recessed structure having source/drain regions 25 and 26 formed above a channel region 21-1.

Referring to FIG. 2, a p-type semiconductor substrate 21 has a recessed part acting as a channel region 21-1, and $n^+$-source/drain regions 25 and 26 which are formed on the substrate 21 except at the recessed part. An insulation film 23 is formed of an oxide film on the source/drain regions 25 and 26. And, a gate insulation film 27 is formed of a thin tunneling oxide film over the surface of the recessed part, at sides of the source/drain regions 25 and 26, respectively, and at sides of the insulation film 23. A floating gate 29 and a control gate 33 with a dielectric film 32 formed of an ONO (Oxide/Nitride/Oxide) film located inbetween are formed on the gate insulation film 27 in the recessed part.

Programming (writing) and erasing operations of the flash EEPROM cell in accordance with a first embodiment of this invention will now be explained.

As in the conventional method for operation of the flash EEPROM cell of the first embodiment of this invention, the hot electron effect can be used for programming and the Fowler-Nordheim tunneling can be used for erasing, or the Fowler-Nordheim tunneling effect can be used for both the programming and the erasing.

When, at programming, the drain region 26 is grounded and the control gate 33 is applied with high voltage, electrons transferred to the floating gate 29 through the thin tunneling oxide film 27 at the side of the drain region 26 are stored therein. Thus, information can be written in the memory cell.

When, at erasing, the control gate 33 is grounded and the source region 25 is applied with high voltage, the electrons stored in the floating gate 29 are transferred to the source region 25 through the thin tunneling oxide film 27 at the side of the source region 25. Thus, information stored in the memory cell can be erased.

Since the flash EEPROM cell in accordance with the first embodiment of this invention includes the recessed channel structure that has the surface of the channel region 21-1 lower than the surface of the semiconductor substrate 21 and the channel region 21-1 positioned lower than the $n^+$-source/drain regions 25 and 26, this makes information programming and erasing through the thin tunneling oxide film 27 at sides of the source/drain regions 25 and 26 possible. Thus, the conventionally required overlapped part between the source region and the floating gate is not required. And, the lateral diffusion of impurities while forming the source/drain regions does not occur. Thus, as the effective cell channel length is not shortened, a desired predetermined cell channel length can be obtained. Thus, shortening of the channel as in the prior art devices, as discussed above, can be prevented.

A method for fabricating the foregoing flash memory cell in accordance with the first embodiment of this invention will now be explained, referring to FIGS. 3A to 3G.

FIGS. 3A to 3G show steps for fabricating the flash memory cell of FIG. 2 according to a first method using, as an example, an $n^+$-polysilicon film for the $n^+$-source/drain regions.

Figure 3A:
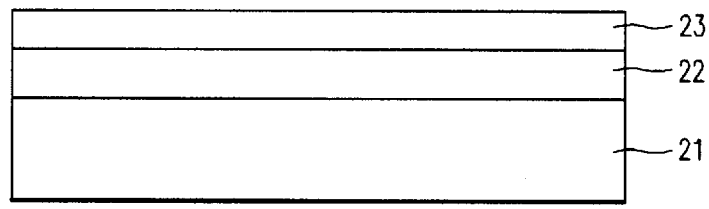
FIGS. 3A to 3G show steps according to a first method for fabricating a flash memory cell having the recessed channel structure of FIG. 2.
Figure 3B:
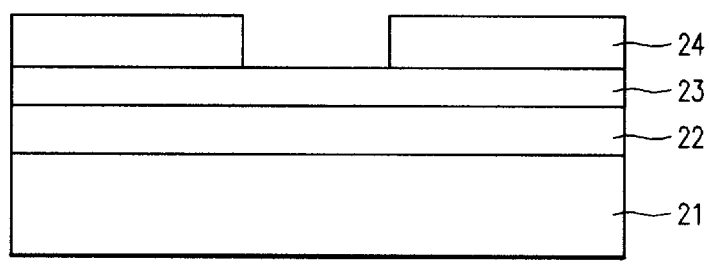

As shown in FIG. 3A, an $n^+$-polysilicon film 22 is formed on a p-type semiconductor substrate 21, and on which an oxide film 23 is formed as an insulation film. As shown in FIG. 3B, a photosensitive film 24 is coated on the oxide film 23, and a portion thereof where a channel region is to be formed is removed. Then the oxide film 23 is exposed.

Figure 3C:
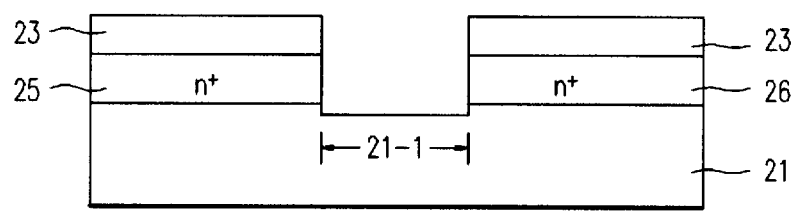

As shown in FIG. 3C, by etching the exposed oxide film 23 and the underlying $n^+$-polysilicon film 22 successively with the photosensitive film 24 used as a mask, the semiconductor substrate 21 is exposed. After etching the exposed substrate, the remaining photosensitive film 24 is removed. The polysilicon film 22 which remains on the substrate becomes source/drain regions 25 and 26, respectively, and the recessed part becomes channel region 21-1. Thus, a recessed channel structure having source/drain regions positioned higher than a channel region is obtained.

Figure 3D:
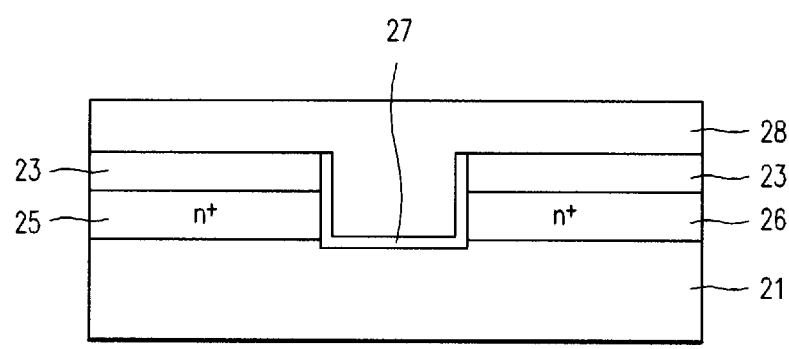
Figure 3E:
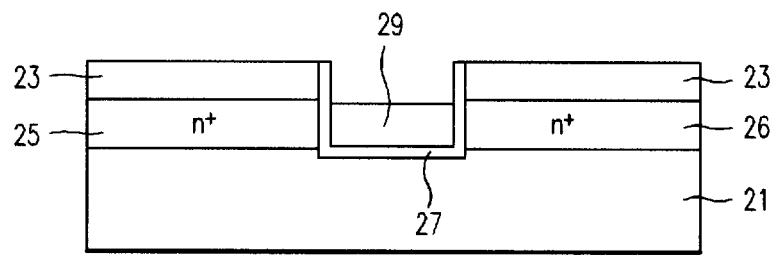

As shown in FIG. 3D, a thin tunneling oxide film is formed as a gate insulation film 27 on the surface of the channel region 21-1, at sides of the source/drain regions 25 and 26, and at sides of the oxide film 23. Then, by forming a polysilicon film 28, as illustrated, and subjecting it to etch back so as to leave the polysilicon film 28 on the tunneling oxide film 27 over the channel region (as shown in FIG. 3E), a floating gate 29 is formed.

Figure 3F:
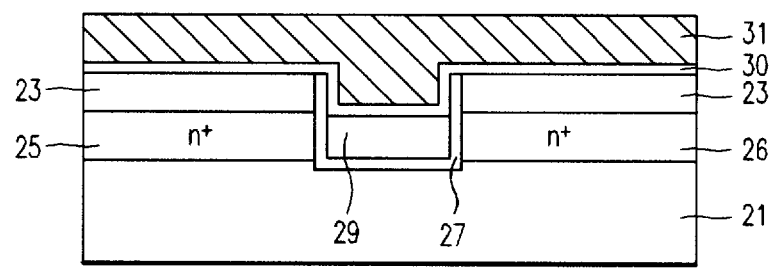

As shown in FIG. 3F, an O/N/O film 30 is formed and, on this, a polysilicon film 31 is formed.

Figure 3G:
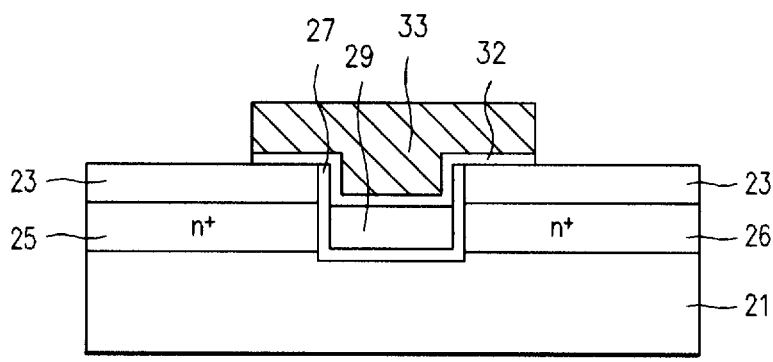

Then, as shown in FIG. 3G, by subjecting the O/N/O film 30 and the polysilicon film 31 to photoetching, a dielectric film 32 and a control gate 33 are formed on the floating gate 29. Thus, a flash EEPROM cell in accordance with the first embodiment of the invention can be fabricated.

FIGS. 4A to 4G show steps for fabricating the flash memory cell of FIG. 2 according to a second method wherein the source/drain regions are formed by injecting $n^+$-type impurities into the substrate with a general ion injection process.

Figure 4A:
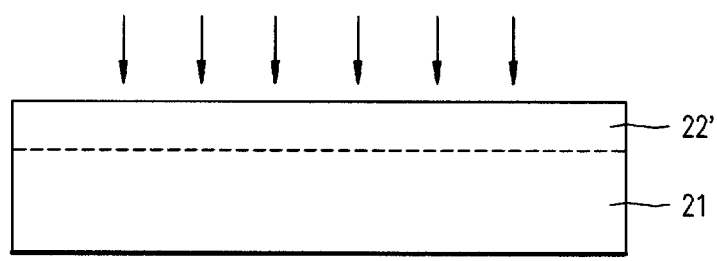
FIGS. 4A to 4G show steps according to a second method for fabricating a flash memory cell having the recessed channel structure of FIG. 2.
Figure 4B:
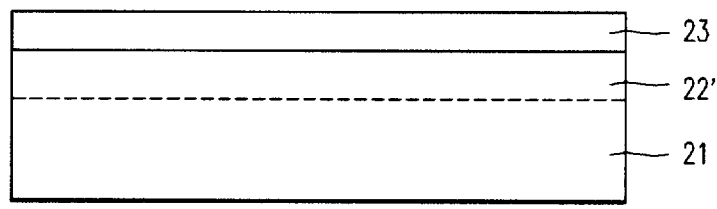
Figure 4C:
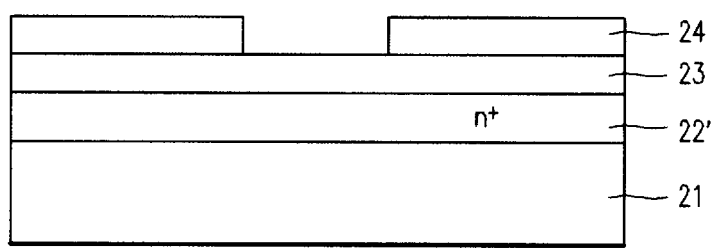

As shown in FIG. 4A, a p-type semiconductor substrate 21 is provided, and an $n^+$-type impurity region 22' is formed in the entirety of the upper part of the substrate by injecting $n^+$-type impurities into the substrate. As shown in FIG. 4B, an oxide film 23 is formed on the $n^+$-type impurity region 22'. Then, by coating a photosensitive film 24 on the oxide film 23 and subjecting it to patterning, the oxide film 23 is exposed as shown in FIG. 4C.

Figure 4D:
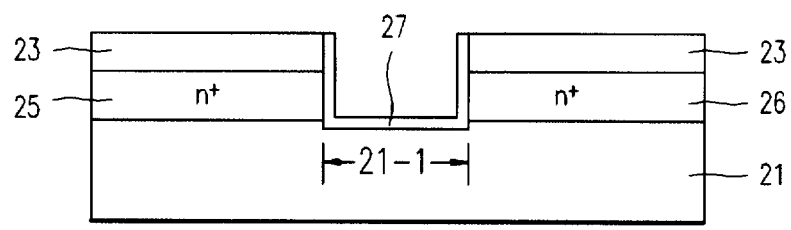

As shown in FIG. 4D, by etching the exposed oxide film 23 with the photosensitive film 24 used as a mask and etching the $n^+$-type impurity region 22'(FIG. 4C) and the underlying part thereof wherein no impurities have been injected, a recessed part is formed. The $n^+$-type impurity regions 22' which remain become source/drain regions 25 and 26, respectively, and the part exposed between them becomes channel region 21-1. Thus, a recessed channel having the source/drain regions higher than the channel region is formed.

Then, a thin tunneling oxide film 27 is formed on the surface of the channel region 21-1 and at sides of the source/drain regions 25 and 26, and at sides of the oxide film 23 as a gate insulation film.

Figure 4E:
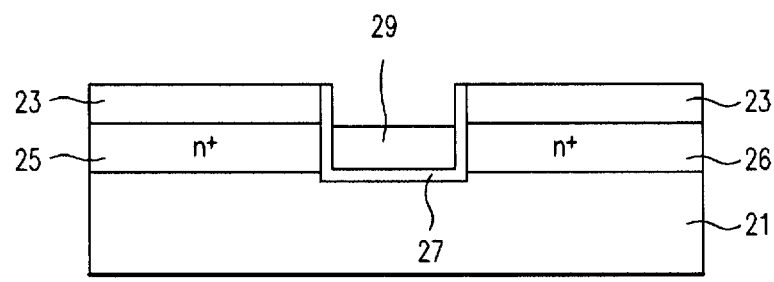

By forming a polysilicon film and subjecting it to etch back so that the polysilicon film is left only on the tunneling oxide film 27 over the channel region, a floating gate 29 is formed as shown in FIG. 4E.

Figure 4F:
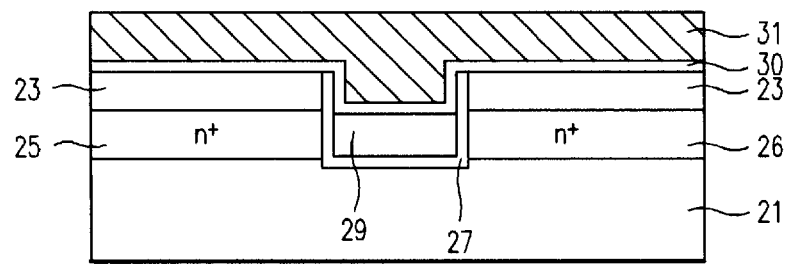

As shown in FIG. 4F, an O/N/O film 30 is formed on the resultant structure and a polysilicon film 31 is formed on O/N/O film 30.

Figure 4G:
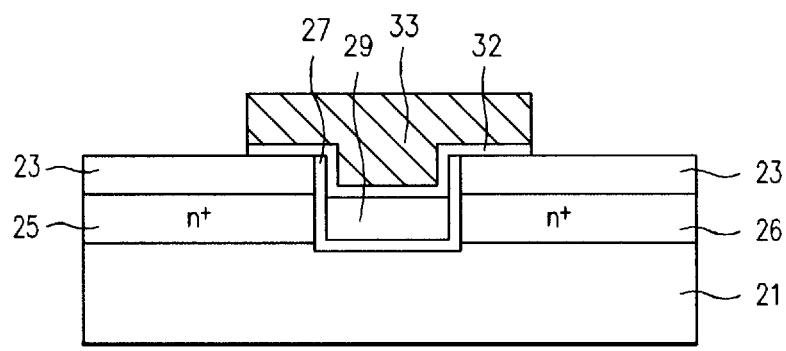

Then, as shown in FIG. 4G, by subjecting the O/N/O film 30 and the polysilicon film 31 to photoetching, a dielectric film 32 and a control gate 33 are formed on the floating gate 29. By this, a flash EEPROM cell in accordance with the first embodiment of this invention can be fabricated according to a second method.

Figure 5:
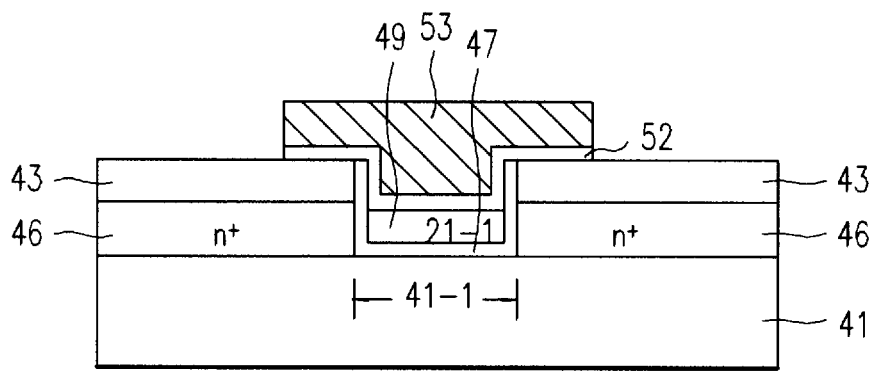
FIG. 5 shows a section of a flash memory cell having a recessed channel structure in accordance with a second embodiment of this invention.

FIG. 5 shows a section of a flash memory cell in accordance with a second embodiment of the invention.

The flash memory cell in accordance with the second embodiment is identical with that of the first embodiment except that the surface of the semiconductor substrate 41 and the surface of the channel region are made to be coplanar.

The flash memory cell in accordance with the second embodiment may be fabricated similar to the method shown in FIGS. 3A to 3G. Steps 3A, 3B and 3D–3G are identical. However, the step of FIG. 3C is modified, as follows. Source/drain regions 45 and 46 (FIG. 5) are formed by etching a polysilicon film 46 so as to merely expose semiconductor substrate 41 without forming a recess. A gate insulation film 47 is formed on the exposed part of the substrate, at sides of the source/drain regions 45 and 46, respectively, and at sides of insulation film 43.

The flash memory cell of the second embodiment may optionally be fabricated according to a second method similar to that illustrated in FIGS. 4A to 4G. Steps 4A–4C and 4E–4F are identical. However, in the step of FIG. 4D, source/drain regions 45 and 46 are formed by merely exposing a part of the substrate 41 without forming a recess in semiconducting substrate 41. Then, a gate insulation film 47 is formed on the exposed part of the substrate, at sides of the source/drain regions 45 and 46, respectively, and at sides of the insulation film 43.

The information writing and erasing operations of the EEPROM cell of FIG. 5 in accordance with the second embodiment are performed through the thin tunneling oxide film 47 at sides of the source/drain regions 45 and 46.

Figure 6:
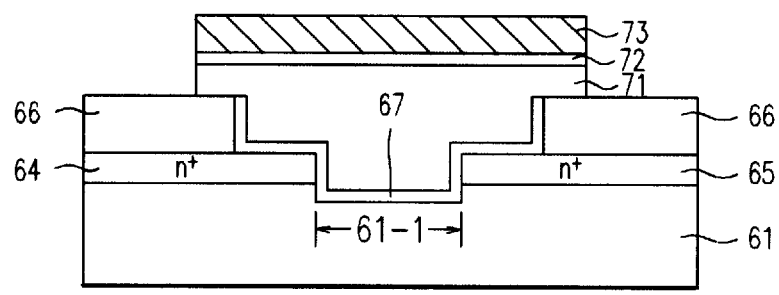
FIG. 6 shows a section of a flash memory cell having a recessed channel structure in accordance with a third embodiment of this invention.

FIG. 6 shows a section of a flash memory cell in accordance with a third embodiment of this invention.

Referring to FIG. 6, the EEPROM cell in accordance with the third embodiment includes a semiconductor substrate 61 having a recessed part acting as a channel region 61-1. Source/drain regions 64 and 65, respectively, of $n^+$ material, are formed on the substrate 61 except in the recessed part 61-1, and an insulation film 66 is formed of an oxide film on the source/drain regions 64 and 65. And, a gate insulation film 67 is formed of a thin tunneling oxide film on the surface of the recessed part, at the sides and exposed portions of the source/drain regions 64 and 65, respectively, and at sides of the insulation film 66. A floating gate 71 and a control gate 73 with dielectric film 72 inbetween are then formed on the gate insulation film 67 and portions of oxide film 66, as illustrated.

As shown in FIG. 6, the EEPROM cell in accordance with the third embodiment can erase information stored in the EEPROM cell faster than the previous embodiments because of this embodiment having a larger area of contact between the source region 64 and the floating gate 71.

FIGS. 7A to 7G show steps of a first method for fabricating the flash memory cell of FIG. 6 using, as an example, an $n^+$-polysilicon film, as the $n^+$ source/drain regions.

As shown in FIG. 7A an $n^+$ polysilicon film 62 is formed on a p-type semiconductor substrate 61, and a photosensitive film 63 is coated thereon. The photosensitive film 63 at a part where a channel region is to be formed is removed to expose the $n^+$-polysilicon film 62.

As shown in FIG. 7B, the exposed $n^+$-polysilicon film 62 is etched with the photosensitive film 63 used as a mask, and then the underlying substrate 61 is etched, to form a recessed part that acts as a channel region 61-1. The polysilicon film that remains on the substrate forms the source/drain regions 64 and 65. Thus, a recessed channel structure that has a channel region positioned lower than the source/drain regions can be obtained.

As shown in FIG. 7C, the remaining photosensitive film 63 is removed and an oxide film 66 is formed over the resultant surface.

As shown in FIG. 7D, the oxide film 66 is subjected to etching to expose the channel region 61-1 and a portion of each of the source/drain regions 64 and 65.

Figure 7E:
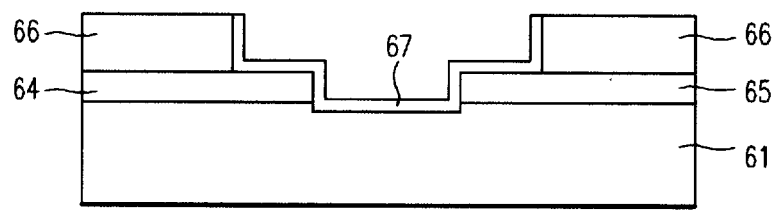

As shown in FIG. 7E, a thin tunneling oxide film 67 is formed as a gate insulation film on the channel region 61-1, the exposed portions of source/drain regions 64 and 65, respectively, and the sides of oxide film 66.

Figure 7F:
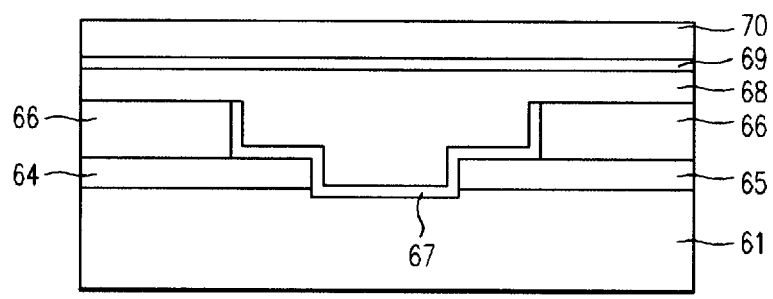
Figure 7G:
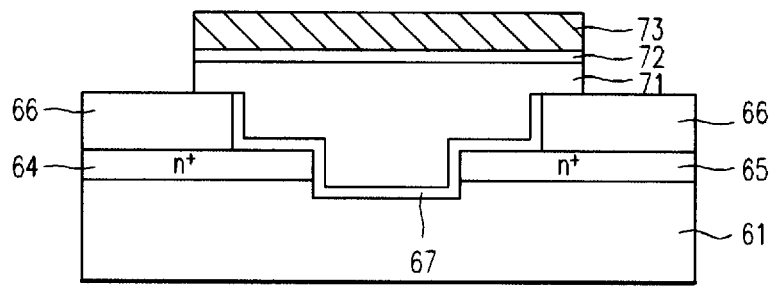

Then, as shown in FIGS. 7F and 7G, a polysilicon film 68, an ONO film 69, and a second polysilicon film 70 are formed over the resultant structure. By subjecting these to etching, a floating gate 71, a dielectric film 72 as an interlayer insulation film, and a control gate 73 are formed on the tunneling oxide film 67 and the oxide film 66 as shown in FIG. 7G.

Thus, the flash EEPROM cell in accordance with the third embodiment of the invention, which can control an erasing time period, can be completed.

FIGS. 8A to 8G show steps of a second method for fabricating the flash memory cell of FIG. 6 showing, as an example, the source/drain regions being formed by ion injecting $n^+$-type impurities into the substrate.

Figure 8A:
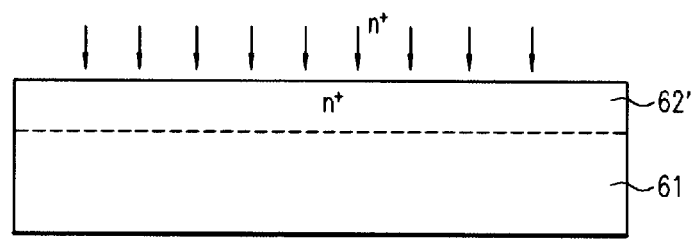
FIGS. 8A to 8G show steps of a second method for fabricating a flash memory cell having the recessed channel structure of FIG. 6.

As shown in FIG. 8A, by injecting $n^+$-type impurities into a p-type semiconductor substrate 61, an $n^+$-impurity region 62' is formed in the upper part of the substrate.

Figure 8B:
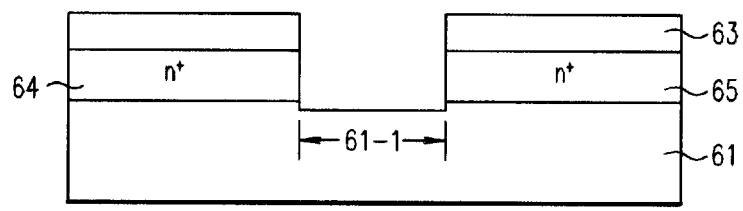
Figure 8C:
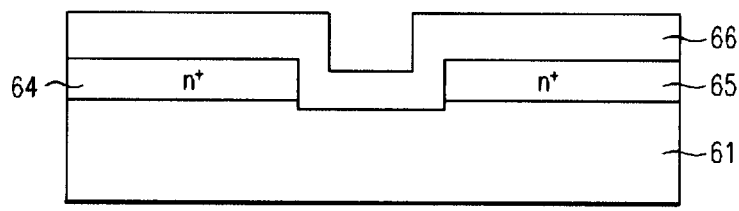
Figure 8D:
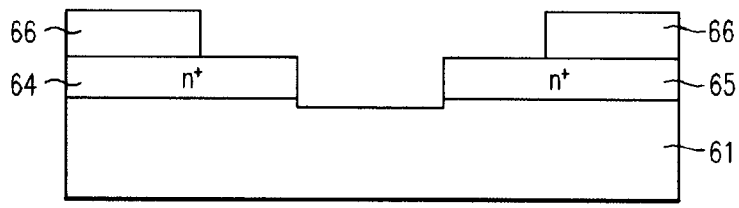
Figure 8E:
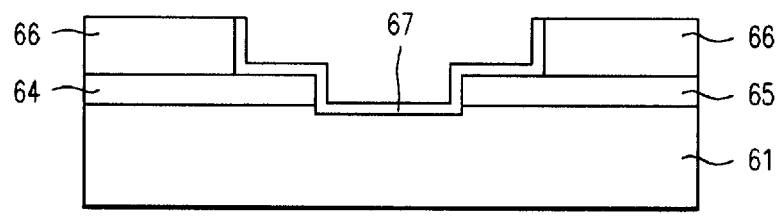
Figure 8F:
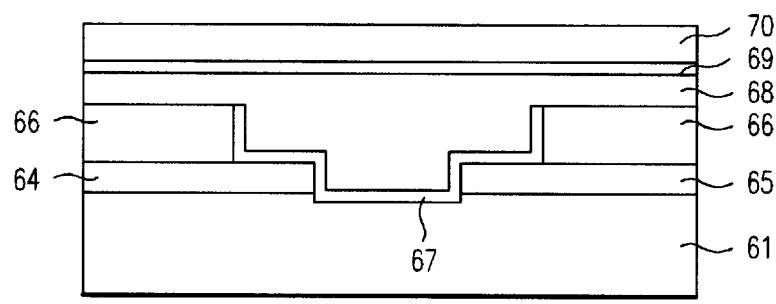
Figure 8G:
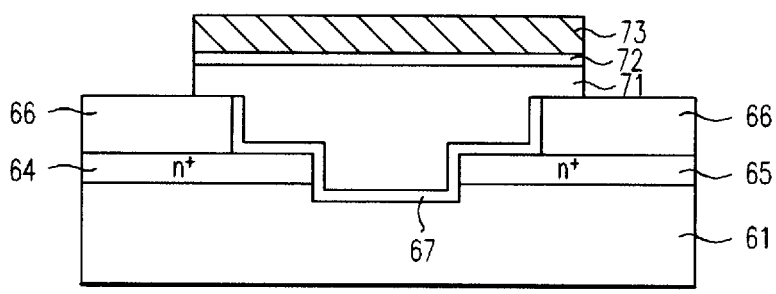

As shown in FIG. 8B, by coating a photosensitive film 63 on the $n^+$-impurity region 62' and subjecting it to a photo-etching process to remove a portion of the photosensitive film 63 and by also etching the underlying substrate 61, a recessed part that is to act as a channel region 61-1 is formed. The remaining $n^+$-impurity regions of the substrate form source/drain regions 64 and 65. Thus, a recessed channel structure that has a channel region positioned lower than source/drain regions can be obtained, as shown in FIG. 8C.

Steps of FIGS. 8D to 8G are identical to the steps of FIGS. 7D to 7G and, thus, no additional explanation will be provided for these figures.

Figure 9:
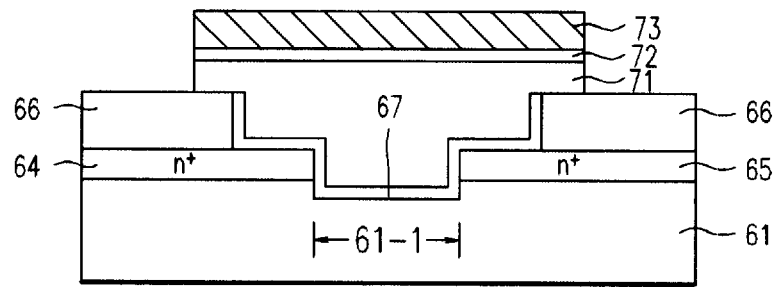
FIG. 9 shows a section of a flash memory cell having a recessed channel structure in accordance with a fourth embodiment of this invention.

FIG. 9 shows a section of an EEPROM cell having a recessed channel structure in accordance with a fourth embodiment of this invention.

All components of the flash EEPROM cell in accordance with the fourth embodiment are identical to those of the third embodiment, illustrated in FIG. 6, except that the surfaces of the semiconductor substrate 61 and the channel region are made to be coplanar.

The EEPROM cell in accordance with the fourth embodiment may be fabricated according to a first method that is similar to that illustrated in FIGS. 7A to 7G, except that a recess is not formed in structure 61.

The EEPROM cell in accordance with the fourth embodiment may, alternately, be fabricated according to a second method that is similar to that of FIGS. 8A to 8G, except that a recess is not formed in substrate 61.

As has been explained, this invention has the following advantages.

Reduction of a channel length caused by lateral diffusion of impurity ions during formation of source/drain regions can be prevented by forming the channel region in a recess such that the channel region is positioned lower than the source/drain regions. And, since both programming and erasing are possible using the tunneling oxide film at sides of the source/drain regions without requiring the conventional overlapped part between the source region and floating gate for erasing, there is no reduction of the channel length.

Accordingly, unlike the conventional art, by preventing any actual reduction of the channel length, large scale integration of flash memory cells can be made possible.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a semiconductor device having a recessed structure comprising the steps of:

forming a second conductivity type semiconductor layer on a first conductivity type substrate wherein the second conductivity type semiconductor layer is formed by depositing a polysilicon film on the first conductivity type substrate;

forming a first insulation film on the second conductivity type semiconductor layer;

forming a source and a drain by removing portions of the first insulation film and the second conductivity type semiconductor layer;

forming a second insulation film on an exposed surface of the substrate and the source and drain;

forming a first gate on the second insulation film;

forming a dielectric film on a surface of the first gate; and forming a second gate on the dielectric film, wherein the first gate fills at least the removed portion of the second conductivity type semiconductor layer.

2. The method as claimed in claim 1, further comprising the step of:

removing a portion of the substrate between the source and drain after forming the source and drain.

3. The method as claimed in claim 2, wherein instead of the depositing step, the second conductivity type semiconductor layer is formed by implanting a second conductivity type impurity into the first conductivity type substrate.

4. A method for fabricating a semiconductor device having a recessed structure comprising the steps of:

forming a second conductivity type semiconductor layer on a first conductivity type substrate wherein the second conductivity type semiconductor layer is formed by depositing a first polysilicon film of the second conductivity type on the first conductivity type substrate;

forming a first insulation film on the second conductivity type semiconductor layer;

forming a source and a drain by removing portions of the first insulation film and the second conductivity type semiconductor layer;

forming a second insulation film on a surface of the substrate between the source and the drain and on the first insulation film;

forming a second polysilicon film, an oxide type film, and a third polysilicon film on the resulting structure and on the substrate; and forming a first gate, a dielectric film, and a second gate by selectively removing the second polysilicon film, the oxide type film, and the third polysilicon film, wherein the first rate fills at least the removed portion of the second conductivity type semiconductor layer.

5. The method as claimed in claim 4, further comprising the step of:

removing a portion of the substrate between the source and drain after forming the source and the drain.

6. The method as claimed in claim 5, wherein instead of the depositing step, the second conductivity type semiconductor layer is formed by implanting a second conductivity type impurity into the first conductivity type substrate.

7. The method as claimed in claim 1, wherein the dielectric film is an oxide/nitride/oxide film.

8. The method as claimed in claim 4, wherein the oxide type film is an oxide/nitride/oxide film.

9. A method for fabricating a semiconductor device, comprising the steps of:

forming a source and a drain separated by a channel on a substrate;

forming a first insulating film on the source and the drain, the first insulating film having a hole passing through the first insulating film;

forming a second insulating film on the substrate and the first insulating film; and forming a first gate, a dielectric film, and a second gate on the first and second insulating films, the first gate completely filling the channel of the substrate and the hole of the first insulating film.

10. The method as claimed in claim 9, wherein said step of forming the drain and the source includes the steps of:

providing a first conductivity type substrate, implanting a second conductivity type impurity into the first conductivity type substrate, and selectively removing an upper surface region of the first conductivity type substrate to form the channel.

11. The method as claimed in claim 9, wherein a width of the hole of the first insulating film is greater than a width of the channel of the substrate.

12. The method as claimed in claim 9, wherein the hole of the first insulating film is directly above the channel of the substrate so as to form a plurality of steps.

13. The method as claimed in claim 9, wherein said step of forming the drain and the source includes the steps of:

providing a first conductivity type substrate, depositing a polysilicon film of a second conductivity type on the first conductivity type substrate, and selectively removing the polysilicon film to form the channel.

14. The method as claimed in claim 9, wherein the dielectric film is an oxide/nitride/oxide film.

15. The method as claimed in claim 9, wherein said step of forming the first gate, the dielectric film, and the second gate includes the steps of:

depositing a first polysilicon layer on the first and second insulting films, the first polysilicon layer completely filling the channel of the substrate and the hole of the first insulating film, depositing a thin oxide layer on the first polysilicon layer, and depositing a second polysilicon layer on the thin oxide layer.

16. The method as claimed in claim 15, wherein said step of forming the first gate, the dielectric film, and the second gate further includes the steps of:

selectively removing the second polysilicon layer, the thin oxide layer and the first polysilicon layer to form the second gate, the dielectric film, and the first gate, respectively.

17. The method as claimed in claim 15, wherein the thin oxide layer is an oxide/nitride/oxide film.

18. A method for fabricating a semiconductor device having a recessed structure comprising the steps of:

forming a second conductivity type semiconductor region on a first conductivity type substrate;

forming a first insulation film on said second conductivity type semiconductor region;

forming a source and drain by etching said first insulation film and the second conductivity type semiconductor region;

etching the substrate between the source and drain after forming the source and drain;

forming a second insulation film on an exposed surface of the substrate and the source and drain;

forming a first gate on the second insulation film;

forming a dielectric film on a surface of the first gate; and forming a second gate on the dielectric film.

* * * * *